(12) United States Patent
Ward

(10) Patent No.: US 9,633,863 B2
(45) Date of Patent: Apr. 25, 2017

(54) COMPOSITIONS AND METHODS FOR SELECTIVE POLISHING OF SILICON NITRIDE MATERIALS

(75) Inventor: William Ward, Glen Ellyn, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 13/546,552

(22) Filed: Jul. 11, 2012

(65) Prior Publication Data

US 2014/0017892 A1    Jan. 16, 2014

(51) Int. Cl.

| | |
|---|---|
| *H01B 13/00* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01L 21/302* | (2006.01) |
| *H01L 21/461* | (2006.01) |
| *H01L 21/3105* | (2006.01) |

(Continued)

(52) U.S. Cl.
CPC ......... *H01L 21/31053* (2013.01); *C09G 1/02* (2013.01); *C09K 3/1409* (2013.01); *C09K 3/1463* (2013.01); *H01L 21/31116* (2013.01); *H01L 21/32139* (2013.01)

(58) Field of Classification Search
None
See application file for complete search history.

(56) References Cited

U.S. PATENT DOCUMENTS

| | | |
|---|---|---|
| 6,936,543 B2 | 8/2005 | Schroeder et al. |
| 6,974,777 B2 | 12/2005 | Moeggenborg et al. |

(Continued)

FOREIGN PATENT DOCUMENTS

| | | |
|---|---|---|
| EP | 2075824 A1 | 1/2009 |
| KR | 1020120077911 A | 7/2012 |

(Continued)

OTHER PUBLICATIONS

European Patent Office, Extended European Search Report issued in connection with European Patent Application No. 13817494.1 on Mar. 23, 2016.

*Primary Examiner* — Stephanie Duclair
(74) *Attorney, Agent, or Firm* — Thomas Omholt; Erika Wilson; Robert J. Ross

(57) ABSTRACT

The present invention provides an acidic aqueous polishing composition suitable for polishing a silicon nitride-containing substrate in a chemical-mechanical polishing (CMP) process. The composition, at point of use, preferably comprises about 0.01 to about 2 percent by weight of at least one particulate ceria abrasive, about 10 to about 1000 ppm of at least one non-polymeric unsaturated nitrogen heterocycle compound, 0 to about 1000 ppm of at least one cationic polymer, optionally, 0 to about 2000 ppm of at least one polyoxyalkylene polymer, and an aqueous carrier therefor. The cationic polymer preferably is selected from a poly (vinylpyridine) polymer, a quaternary ammonium-substituted acrylate polymer, a quaternary ammonium-substituted methacrylate polymer, or a combination thereof. Methods of polishing substrates and of selectively removing silicon nitride from a substrate in preference to removal of polysilicon using the compositions are also provided.

6 Claims, 1 Drawing Sheet

(51) Int. Cl.
*H01L 21/311* (2006.01)
*H01L 21/3213* (2006.01)
*C09K 3/14* (2006.01)
*C09G 1/02* (2006.01)

(56) References Cited

U.S. PATENT DOCUMENTS

| | | | |
|---|---|---|---|
| 2006/0108326 A1* | 5/2006 | Dysard et al. | 216/88 |
| 2007/0181534 A1 | 8/2007 | Kamimura | |
| 2007/0209287 A1 | 9/2007 | Chen et al. | |
| 2007/0298612 A1 | 12/2007 | Dysard et al. | |
| 2009/0253355 A1* | 10/2009 | Koyama et al. | 451/41 |
| 2010/0068883 A1* | 3/2010 | Shin et al. | 438/693 |
| 2010/0151684 A1 | 6/2010 | Choi et al. | |
| 2010/0248593 A1 | 9/2010 | Sakai et al. | |
| 2011/0117821 A1* | 5/2011 | Nishimoto et al. | 451/36 |
| 2013/0059439 A1 | 3/2013 | Shinoda et al. | |

FOREIGN PATENT DOCUMENTS

| | | | |
|---|---|---|---|
| WO | 2004069947 A1 | | 8/2004 |
| WO | 2007067294 A2 | | 6/2007 |
| WO | 2008082177 A1 | | 7/2008 |
| WO | 2008/107472 | * | 9/2009 |

* cited by examiner

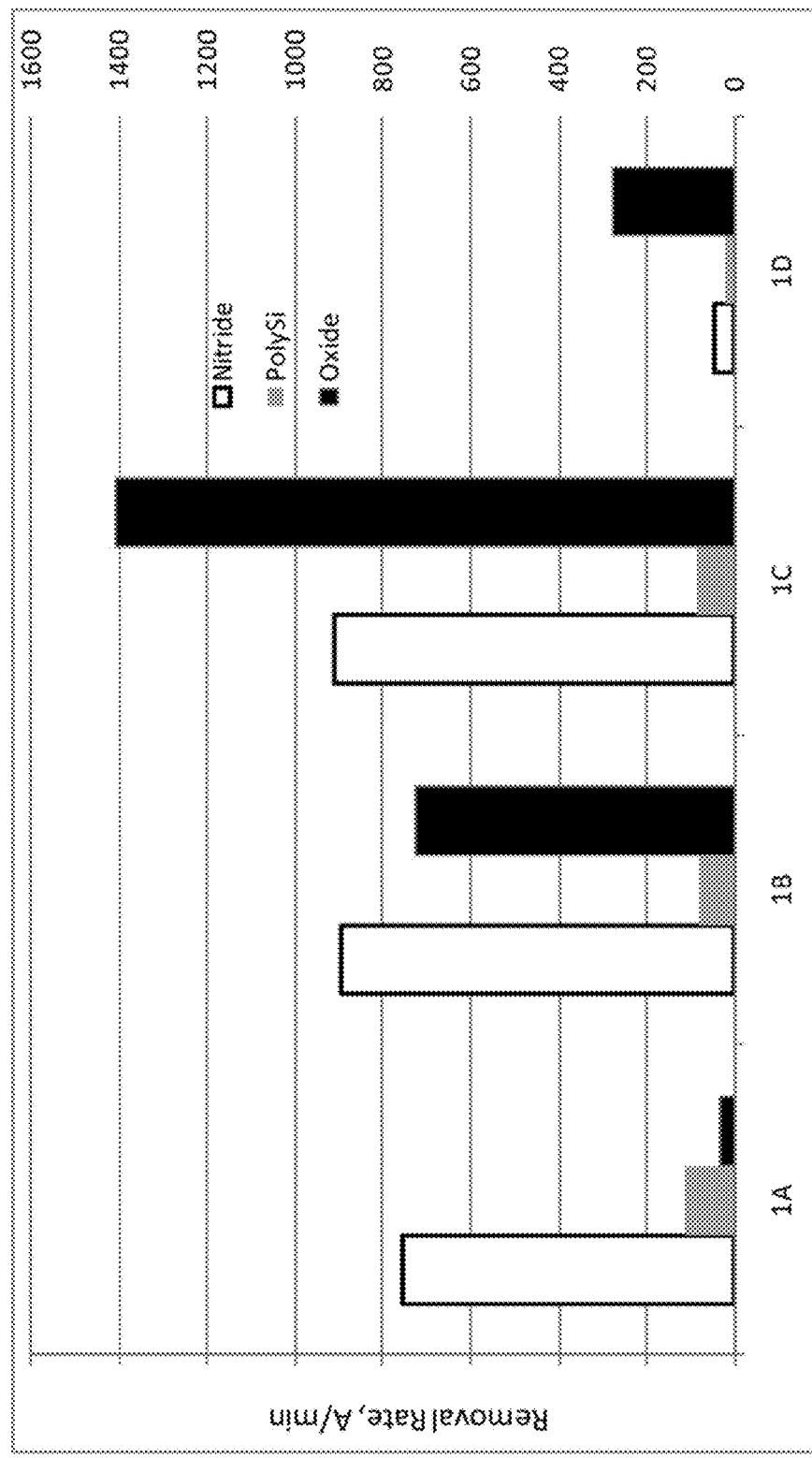

COMPOSITIONS AND METHODS FOR SELECTIVE POLISHING OF SILICON NITRIDE MATERIALS

FIELD OF THE INVENTION

This invention relates to polishing compositions and methods. More particularly, this invention relates to methods for polishing silicon nitride-containing substrates and compositions therefor.

BACKGROUND OF THE INVENTION

A semiconductor wafer for integrated circuits typically includes a substrate, such as silicon or gallium arsenide, on which a plurality of transistors have been formed. Transistors are chemically and physically connected to the substrate by patterning regions in the substrate and layers on the substrate. The transistors and layers are separated by inter-level dielectrics (ILDs), comprised primarily of some form of silicon oxide ($SiO_2$). The transistors are interconnected through the use of well-known multilevel interconnects. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (poly-Si), and various combinations thereof. In addition, transistors or groups of transistors are isolated from one another, often through the use of trenches filled with an insulating material such as silicon dioxide, silicon nitride, and/or polysilicon. During semiconductor manufacture, various layers of the aforementioned materials must be removed in order to form the various components of the circuits on the wafer, which typically is achieved by chemical-mechanical polishing (CMP).

Compositions and methods for CMP of the surface of a substrate are well known in the art. Polishing compositions (also known as polishing slurries, CMP slurries, and CMP compositions) for CMP of surfaces of semiconductor substrates (e.g., for integrated circuit manufacture) typically contain an abrasive, various additive compounds, and the like.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents, acids, bases, or other additives present in the CMP composition) and/or the mechanical activity of an abrasive suspended in the polishing composition. Typical abrasive materials include silicon dioxide, cerium oxide, aluminum oxide, zirconium oxide, and tin oxide.

In general, CMP involves the concurrent chemical and mechanical abrasion of surface, e.g., abrasion of an overlying first layer to expose the surface of a non-planar second layer on which the first layer is formed. One such process is described in U.S. Pat. No. 4,789,648 to Beyer et al. Briefly, Beyer et al., discloses a CMP process using a polishing pad and a slurry to remove a first layer at a faster rate than a second layer until the surface of the overlying first layer of material becomes coplanar with the upper surface of the covered second layer. More detailed explanations of chemical mechanical polishing are found in U.S. Pat. No. 4,671,851, No. 4,910,155 and No. 4,944,836.

U.S. Pat. No. 5,527,423 to Neville, et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

Although known CMP slurry compositions typically are suitable for limited purposes, many conventional compositions exhibit unacceptable polishing rates and correspondingly unacceptable selectivity for removal of insulator materials used in wafer manufacture. In addition, many known polishing slurries produce poor film removal traits for the underlying films or produce deleterious film-corrosion, which leads to poor manufacturing yields.

As the technology for integrated circuit devices advances, traditional materials are being used in new and different ways to achieve the level of performance needed for advanced integrated circuits. In particular, silicon nitride, silicon oxide, and polysilicon are being used in various combinations to achieved new and ever more complex device configurations. In general, the structural complexity and performance characteristics vary across different applications. There is an ongoing need for methods and compositions that allow for the removal rates of silicon nitride, silicon oxide and polysilicon materials to be adjusted or tuned during CMP to meet the polishing requirements for particular IC devices.

For example, there is a continuing need to achieve rapid silicon nitride removal rates for many IC device applications. Traditional polishing slurries have been designed for "stop on silicon nitride" applications, such as in shallow trench isolation (STI). Typical STI slurries utilize silica abrasives at high pH and high abrasive concentrations to achieve reasonable silicon nitride removal rates. The use of high abrasive particle concentrations has been associated with a high level of scratch defects in the polished devices.

There is an ongoing need to develop new polishing methods and compositions that provide relatively high rates of removal of silicon nitride and for selective removal of silicon nitride in preference to polysilicon. The present invention addresses these ongoing needs. These and other advantages of the invention, as well as additional inventive features, will be apparent from the description of the invention provided herein.

BRIEF SUMMARY OF THE INVENTION

The present invention provides an acidic aqueous polishing composition (e.g., having a pH of about 2 to about 6) suitable for removal of silicon nitride from a surface of a substrate in a chemical-mechanical polishing (CMP) process. The composition comprises, consists essentially of, or consists of at least one particulate ceria abrasive, at least one non-polymeric unsaturated nitrogen heterocycle (UNH) compound, optionally at least one cationic polymer, optionally a polyoxyalkylene polymer, and an aqueous carrier. The cationic polymer preferably is selected from poly(vinylpyridine) polymer, a quaternary ammonium-substituted acrylate polymer, a quaternary ammonium-substituted methacrylate polymer, or a combination of two or more of such cationic polymers. More preferably the cationic polymer comprises a quaternary ammonium-substituted polymer or a combination of quaternary ammonium-substituted polymer and a poly(vinylpyridine) polymer, such as poly(4-vinylpyridine). The UNH compound is an organic compound including a heterocyclic ring structure composed of carbon and nitrogen atoms arranged in a 5 or 6-membered ring, in which the ring includes at least one double bond between two carbon atoms, two nitrogen atoms, or a carbon and a nitrogen atoms. Preferably, the heterocyclic ring is a heteroaromatic group, such as a pyridine group (including pyridine compounds having an alkylated nitrogen, i.e., a pyridinium group), a pyrazole group, a pyrazine group, a pyridizine group, and the like. One preferred type of UNH compound is a pyridine compound.

In one preferred embodiment, the CMP composition comprises, consists essentially of, or consists of (a) about 0.01 to about 10 percent by weight (wt %) of at least one particulate ceria abrasive (e.g., calcined ceria); (b) about 10 to about 100,000 ppm of at least one non-polymeric UNH compound (e.g., 4,4'-trimethylenedipyridine); (c) 0 to about 100,000 parts-per-million (ppm) of at least one cationic polymer; (d) 0 to about 200,000 ppm of at least one polyoxyalkylene polymer; and (e) an aqueous carrier therefor.

In another preferred embodiment, the CMP composition has a pH of about 2 to 6 and comprises, consists essentially of, or consists of (a) about 0.05 to about 5 wt % t of at least one particulate ceria abrasive; (b) about 10 to about 10,000 ppm of 4,4'-trimethylenedipyridine; (c) about 10 to about 10,000 ppm of at least one cationic polymer selected from the group consisting of a poly(vinylpyridine) polymer, a quaternary ammonium-substituted acrylate polymer, a quaternary ammonium-substituted methacrylate polymer, or a combination of any of the foregoing cationic polymers; (d) about 200 to about 20,000 ppm of at least one polyoxyalkylene polymer selected from a poly(ethylene glycol) polymer, a poly(ethylene glycol)-co-poly(propylene glycol) block copolymer, or a combination thereof; and (e) an aqueous carrier therefor.

In some preferred embodiments, the polyoxyalkylene polymer comprises, consists essentially of, or consists of a poly(ethylene glycol) polymer (i.e., a PEG) having an average number of ethylene glycol monomer units in the range of about 200 to about 2000, more preferably about 300 to about 1500 monomer units. In other preferred embodiments, the polyoxyalkylene polymer comprises a poly(ethylene glycol)-co-poly(propylene glycol) block copolymer, such as a poly(ethylene glycol)-end capped poly(propylene glycol), i.e., a PEG-PPG-PEG block copolymer.

In another aspect, the present invention provides a chemical-mechanical polishing method for polishing a silicon nitride-containing substrate with the CMP composition described herein to selectively remove silicon nitride in preference to polysilicon. A preferred method comprises, consists essentially of, or consists of the steps of contacting a surface of a silicon nitride-containing substrate with a polishing pad and the aqueous polishing composition, and causing relative motion between the polishing pad and the substrate while maintaining a portion of the polishing composition in contact with the surface between the pad and the substrate for a time period sufficient to abrade at least a portion of the substrate surface. The polishing composition comprises, at point of use, about 0.01 to about 2 wt % of the ceria abrasive, about 10 to about 1000 ppm of the non-polymeric UNH compound, 0 to about 1000 ppm of the cationic polymer, and 0 to about 2000 ppm of the polyoxyalkylene polymer, and an aqueous carrier, as described herein.

The compositions of the invention provide the advantage of high silicon nitride removal rates, low polysilicon removal rates, and silicon oxide removal rates that can be adjusted from low to high.

BRIEF DESCRIPTION OF THE DRAWINGS the FIGURE provides a graph of removal rate for silicon oxide (Oxide), polysilicon (PolySi), and silicon nitride (Nitride) obtained by polishing blanket wafers with selected compositions of the present invention.

DETAILED DESCRIPTION OF THE INVENTION

The present invention provides compositions and methods for polishing a silicon nitride-containing surface. In a preferred embodiment, a composition of the present invention comprises an acidic aqueous carrier containing about 0.01 to about 10 wt % of at least particulate ceria abrasive, about 10 to about 100,000 ppm of at least one non-polymeric UNH compound, 0 to about 100,000 ppm of at least one cationic polymer (preferably at least about 10 ppm), and 0 to about 200,000 ppm of at least one polyoxyalkylene polymer (preferably at least about 10 ppm).

The particulate ceria abrasive can be present in the polishing composition at a concentration in the range of about 0.01 to about 10 wt %. Preferably, the ceria is present in the CMP composition at a concentration in the range of about 0.05 to about 5 wt %. At point of use, the ceria abrasive preferably is present at a concentration of about 0.01 to about 2 wt %, more preferably about 0.05 to about 0.5 wt % (e.g., about 0.1 to about 0.3 wt %). The abrasive particles preferably have a mean particle size in the range of about 30 nm to about 200 nm, more preferably about 75 nm to about 125 nm, as determined by laser light scattering techniques, which are well known in the art. Preferably the ceria comprises, consists essentially of, or consists of calcined ceria. Optionally, the ceria can comprise, consist essentially of, or consist of a hydrated ceria.

The particulate abrasive desirably is suspended in the polishing composition, more specifically in the aqueous carrier component of the polishing composition. When the abrasive is suspended in the polishing composition, it preferably is colloidally stable. The term "colloid" refers to the suspension of abrasive particles in the liquid carrier. "Colloidal stability" refers to the maintenance of that suspension over time. In the context of this invention, a ceria suspension is considered colloidally stable if, when the ceria suspension is placed into a 100 mL graduated cylinder and allowed to stand without agitation for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the abrasive composition ([C] in terms of g/mL) is less than or equal to 0.5 (i.e., ([B]−[T])/[C]≤0.5). The value of ([B]−[T])/[C] desirably is less than or equal to 0.3, and preferably is less than or equal to 0.1.

As used herein and in the appended claims, the term "calcined ceria" refers to a cerium(IV) oxide material formed by heating (calcining) a hydrated cerium oxide or a decomposable precursor salt or mixture of salts such as cerium carbonate, cerium hydroxide, and the like. In the case of a hydrated cerium oxide, the material is heated at a temperature sufficient to remove water of hydration from the cerium oxide material (e.g., at a temperature of 600° C. or greater). In the case of precursor salts, the salts are heated at temperature above the decomposition temperature of the precursor (e.g., 600° C. or greater) to form $CeO_2$ (ceria) and at the same time drive off any water that may be present or formed. The ceria can include amounts of stabilizing dopant materials such as La and Nd, if desired, as is known in the art. Typically, calcined ceria particles are highly crystalline. Methods of preparing calcined ceria are well known in the art. The abrasive concentration in the composition is about 0.01 to about 10 percent by weight (wt %), preferably about 0.05 to about 5 wt %.

Preferably, the concentration of the abrasive in the composition, at the point of use in the present methods, is in the range of about 0.01 to about 2 wt %, more preferably about 0.05 to about 0.5 wt %. The concentration of the at least one cationic polymer in the composition is in the range of 0 (preferably about 10 ppm) to about 100,000 ppm, more preferably about 10 ppm to about 10,000 ppm. At point of use, the composition preferably comprises about 0 (preferably about 10 ppm) to about 1000 ppm of the at least one cationic polymer, more preferably about 10 ppm to about 100 ppm for each cationic polymer present. The concentration of the non-polymeric UNH compound is in the range of about 10 to about 100,000 ppm, preferably about 10 to about 1000 ppm. Preferably, the composition includes, at point of use about 10 to about 300 ppm of the non-polymeric UNH compound, more preferably about 10 to about 100 ppm. In a preferred embodiment, the polyoxyalkylene polymer is present in the composition at a concentration in the range of about 10 to about 200,000 ppm, more preferably about 200 to about 100,000 ppm. At point of use, the composition preferably comprises about 10 ppm to about 2000 ppm of the polyoxyalkylene polymer, more preferably about 200 ppm to about 1000 ppm.

The compositions of the present invention are acidic, and preferably have a pH in the range of about 2 to about 6, more preferably about 3 to about 5. The acidity of the composition can be achieved and/or maintained by inclusion of a buffering material including an acidic component, which can be any inorganic or organic acid. In some preferred embodiments, the acidic component can be an inorganic acid, a carboxylic acid, an organophosphonic acid, an acidic heterocyclic compound, a salt thereof, or a combination of two or more of the foregoing. Non-limiting examples of suitable inorganic acids include hydrochloric acid, sulfuric acid, phosphoric acid, phosphorous acid, pyrophosphoric acid, sulfurous acid, and tetraboric acid, or any acidic salt thereof. Non-limiting examples of suitable carboxylic acids include, monocarboxylic acids (e.g., acetic acid, benzoic acid, phenylacetic acid, 1-naphthoic acid, 2-naphthoic acid, glycolic acid, formic acid, lactic acid, mandelic acid, and the like), and polycarboxylic acids (e.g., oxalic acid, malonic acid, succinic acid, adipic acid, tartaric acid, citric acid, maleic acid, fumaric acid, aspartic acid, glutamic acid, phthalic acid, isophthalic acid, terephthalic acid, 1,2,3,4-butanetetracarboxylic acid, itaconic acid, and the like), or any acidic salt thereof. Non-limiting examples of suitable organic phosphonic acids include phosphonoacetic acid, iminodi (methylphosphonic acid), DEQUEST® 2000LC brand amino-tri(methylenephosphonic acid), and DEQUEST® 2010 brand hydroxyethylidene-1,1-diphosphonic acid, both of which are available from Solutia, or any acidic salt thereof. Non-limiting examples of suitable acidic heterocyclic compounds include uric acid, ascorbic acid, and the like, or any acidic salt thereof.

In some embodiments, the cationic polymer component comprises, consists essentially of, or consists of a poly (vinylpyridine) polymer, such as poly(2-vinylpyridine), poly (4-vinylpyridine), a vinylpyridine copolymer, and the like. Vinylpyridine copolymers useful in the compositions and methods of the present invention include copolymers comprising at least one vinylpyridine monomer (e.g., 2-vinylpyridine, 4-vinylpyridine, or both) and at least one comonomer selected from a nonionic monomer and a cationic monomer. Non-limiting examples of nonionic comonomers include acrylamide, methacrylamide, N-vinylpyrrolidinone, and styrene. Non-limiting examples of cationic comonomers include diallylamine, dimethyldiallylamine, a 2-vinyl-N-methylpyridinium halide (e.g., chloride), a 4-vinyl-N-methylpyridinium halide (e.g., chloride), 2-(diethylaminoethyl)styrene, 2-(N,N-diethylaminoethyl) acrylate, 2-(N,N-diethylaminoethyl)methacrylate, N-(2-(N, N-diethylaminoethyl)methacrylamide, N-(2-(N,N-diethylaminopropyl)methacrylamide, a salt of any of the foregoing (e.g., a hydrochloride salt), an N-quaternized derivative of any of the foregoing (e.g., an N-methyl quaternized derivative), and the like. In addition, relatively small proportions of anionic monomers (e.g., acrylic acid, methacrylic acid, styrenesulfonic acid, 2-acrylamido-2-methylpropane sulfonic acid (AMPS), and the like) can be included in the copolymer, so long as the proportion of anionic monomer to cationic monomers is such that the copolymer retains an overall cationic charge.

In some other embodiments, the cationic polymer component comprises, consists essentially of, or consists of a quaternary ammonium-substituted polymer, such as a quaternary ammonium-substituted acrylate or methacrylate polymer. Non-limiting examples of such quaternary ammonium-substituted acrylate or methacrylate polymers include poly(methacryloyloxyethyl trimethylammonium halide) polymers, poly(acryloyloxyethyl trimethylammonium halide) polymers, poly(methacryloyloxyethyl dimethylbenzylammonium halide) polymers, poly(acryloyloxyethyl dimethylbenzylammonium halide) polymers, and the like. Preferably, the halide counter-ion of the quaternary ammonium group is chloride.

The cationic polymer can have any suitable molecular weight. Typically, the polishing composition comprises a cationic polymer having a weight average molecular weight of about 5 kDa or more (e.g., about 10 kDa or more, about 20 kDa or more, about 30 kDa or more, about 40 kDa or more, about 50 kDa or more, or about 60 kDa or more) cationic polymer. The polishing composition preferably comprises a cationic polymer having a molecular weight of about 100 kDa or less (e.g., about 80 kDa or less, about 70 kDa or less, about 60 kDa or less, or about 50 kDa or less). Preferably, the polishing composition comprises a cationic polymer having a molecular weight of about 5 kDa to about 100 kDa (e.g., about 10 kDa to about 80 kDa, about 10 kDa to about 70 kDa, or about 15 kDa to about 70 kDa.

The polyoxyalkylene component, also known as a poly (alkylene glycol), can be a homopolymer or copolymer (e.g., a block or random copolymer) comprising a plurality of oxyalkylene monomer units (i.e., alkylene glycol monomer units, such as ethylene glycol, propylene glycol, butylene glycol, and the like). For example, the polyoxyalkylene polymer can be a poly(ethylene glycol) polymer, a poly (ethylene glycol)-co-poly(propylene glycol) copolymer (an EO/PO block copolymer), and the like. The polyoxyalkylene polymer preferably comprises, on average, about 20 to about 2000 monomer units (e.g., ethylene glycol, propylene glycol, and the like), more preferably about 200 to about 2000 monomer units (e.g., about 300 to about 1500 monomer units). Such polymers are frequently referred to in the art by the type of polymer and the average number of monomer units, e.g., poly(ethylene glycol)-300, abbreviated PEG-300, which refers to a poly(ethylene glycol) polymer having an average of about 300 ethylene glycol ($CH_2CH_2O$), units, and therefore having a number average molecular weight of about 300×44=13200 Daltons.

In one preferred embodiment, the polyoxyalkylene polymer is a polyoxyethylene polymer, i.e., a poly(ethylene glycol) polymer. In other preferred embodiments, the polyoxyalkylene polymer comprises a poly(ethylene glycol)-co-poly(propylene glycol) copolymer block copolymer, such as a PEG-PPG-PEG block copolymer, e.g., PLURONIC L31 from BASF, which reportedly has a number average molecular weight of around 1100 to 1200 and includes a PPG core having an average or about 16 propylene glycol units, which is capped on each end with an average of about 2 ethylene glycol monomer units.

The non-polymeric unsaturated nitrogen heterocycle compound can be any organic compound including a heterocyclic ring structure composed of carbon and nitrogen atoms arranged in a 5 or 6-membered ring, in which the ring includes at least one double bond between two carbons, two nitrogens, or a carbon and a nitrogen. Non-limiting examples of such non-polymeric unsaturated nitrogen heterocycle compounds include pyridine compounds (e.g., pyridine, 1,3-bis(4-pyridyl)propane, 1,2-phenyl-1,3-di(4-pyridinyl)-2-propanol, 1,2-bis(4-pyridyl)ethane, 1,2-bis(4-pyridyl)-1,2-ethanediol, and the like), pyridinium compounds, (e.g., pyridinium salts (for example halide salts) such as 1-ethylpyridinium chloride, 1-benzylpyridinium bromide, 2-chloro-1-methylpyridinium iodide, 4-methyl-1-propylpyridinium iodide, 1-ethyl-4-(methoxycarbonyl)pyridinium iodide, 1,4, dimethylpyridinium iodide, paraquat dichloride, 1-(4-pyridyl)pyridinium chloride, ethyl viologen diiodide, p-xylene-bis(N-pyridinium bromide), 1,1'-tetramethylenebis(pyridinium chloride), and the like), pyazole compounds, pyrazine compounds, and pyridazine compounds. In some preferred embodiments the non-polymeric UNI-1 compound comprises, consists essentially of, or consists of a pyridine compound, particularly 4,4'-trimethylenedipyridine (also known as 1,3-bis(4-pyridyl)propane).

The compositions and methods of the invention provide useful silicon nitride removal rates and selectivity for removal of silicon nitride over removal of polysilicon. The compositions of the invention also can be tailored to provide different rates of silicon oxide removal primarily by utilizing different concentrations of cationic polymer, the non-polymeric UNH compound, and an EO/PO block copolymer. In some particularly preferred embodiments, the silicon nitride removal rate is about 700 Angstroms-per-minute (Å/min) or greater and polysilicon removal of less than about 150 Å/min (typically less than about 100 Å/min) when polishing a silicon nitride or polysilicon blanket wafer, respectively, on a table-top CMP polisher at a down force of about 3 pounds-per-square inch (psi), a platen speed of about 100 revolutions-per-minute (rpm), a carrier speed of about 101 rpm, and a polishing slurry flow rate of about 150 milliliters-per-minute (mL/min) with a D100 polishing pad. The silicon oxide removal rates typically range from about 100 Å/min to 2000 Å/min under the same conditions depending upon the concentrations of poly(vinylpyridine) and/or the non-polymeric UNH compound, and the presence or absence of an EO/PO block copolymer, such as PLURONIC® L31 (BASF). The lower concentrations of cationic polymer and non-polymeric UNH compound typically lead to moderate silicon oxide removal rates, while silicon oxide removal rates tend to be higher with increasing amounts of cationic polymer and non-polymeric UNH compound. The presence of an EO/PO block copolymer (e.g., about 500 ppm of PLURONIC® L31) tends to provide low silicon oxide removal rates at pH values of 3 to 5.

The polishing compositions of the invention optionally can include one or more oxidizing agent (e.g., to oxidize a component of the semiconductor surface, such as a metal component). Oxidizing agents suitable for use in the polishing compositions and methods of the present invention include, without limitation hydrogen peroxide, persulfate salts (e.g., ammonium monopersulfate, ammonium dipersulfate, potassium monopersulfate, and potassium dipersulfate), periodate salts (e.g., potassium periodate), salts thereof, and a combination of two or more of the foregoing. Preferably, the oxidizing agent is present in the composition in an amount sufficient to oxidize one or more selected metallic or semiconductor material present in the semiconductor wafer, as is well known in the semiconductor CMP art.

The polishing compositions of the invention can also optionally include suitable amounts of one or more other additive materials commonly included in polishing compositions, such as metal complexing agents, corrosion inhibitors, viscosity modifying agents, biocides, and the like.

In preferred embodiments, the polishing compositions further comprise a biocidal amount of a biocide (e.g., an isothiazolinone composition such as KATHON® biocide, available from Rohm and Haas).

The aqueous carrier can be any aqueous solvent, e.g., water, aqueous methanol, aqueous ethanol, a combination thereof, and the like. Preferably, the aqueous carrier comprises predominately deionized water.

The polishing compositions of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., ceria, acids, UNH compound, polymers, buffers, oxidizing agents, and the like), as well as any combination of ingredients. For example, the ceria abrasive can be dispersed in water, combined with the polymer components, and mixed by any method that is capable of incorporating the components into the polishing composition. Typically, an oxidizing agent, when utilized, is not added to the polishing composition until the composition is ready for use in a CMP process, for example, the oxidizing agent can be added just prior to initiation of polishing. The pH can be further adjusted at any suitable time by addition of an acid or base, as needed.

The polishing compositions of the present invention also can be provided as a concentrate, which is intended to be diluted with an appropriate amount of aqueous solvent (e.g., water) prior to use. In such an embodiment, the polishing composition concentrate can include the various components dispersed or dissolved in aqueous solvent in amounts such that, upon dilution of the concentrate with an appropriate amount of aqueous solvent, each component of the polishing composition will be present in the polishing composition in an amount within the appropriate range for use.

The invention also provides a method of chemically-mechanically polishing a silicon nitride substrate, e.g., for selective removal of silicon nitride relative to removal of polysilicon. The method comprises (i) contacting a surface of a silicon nitride-containing substrate with a polishing pad and a polishing composition of the invention as described herein, and (ii) moving the polishing pad relative and the surface of the substrate relative to one another, while maintaining at least a portion of the polishing composition between the pad and the surface, thereby abrading at least a portion of the surface to polish the substrate.

The polishing compositions of the present invention can be used to polish any suitable substrate, and are especially useful for polishing substrates comprising silicon nitride, as well as substrates containing silicon nitride and polysilicon and/or silicon oxide. The compositions of the present invention provide relatively high silicon nitride removal rates at abrasive levels low enough to avoid excessive scratch defects. In particular, the formulation and pH of the CMP composition can be varied to vary the silicon nitride removal rate. In addition, the relative rate of silicon nitride removal exceeds the rate for removal of polysilicon and silicon oxide. This selectivity is an additional asset for use in polishing modern semiconductor materials with relatively narrow oxide line widths.

The polishing compositions of the present invention are particularly suited for use in conjunction with a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate, so as to abrade at least a portion of the substrate to polish the substrate.

A substrate can be planarized or polished with a polishing composition of the invention using any suitable polishing surface (e.g., polishing pad). Suitable polishing pads include, for example, woven and non-woven polishing pads, grooved or non-grooved pads, porous or non-porous pads, and the like. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al., Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate certain aspects of the invention but, of course, should not be construed as in any way limiting its scope. As used herein and in the following examples and claims, concentrations reported as parts-per-million (ppm) are based on the weight of the active component of interest divided by the weight of the composition (e.g., as milligrams of component per kilogram of composition).

Example 1

This example illustrates the effect of cationic polymers and a non-polymeric UNH compound on removal of silicon nitride, polysilicon, and silicon oxide.

Polishing compositions were used to separately chemically-mechanically polish silicon nitride, silicon oxide, and polysilicon blanket wafers on a Mirra 200 mm CMP apparatus with a D100 polishing pad. Each of the polishing compositions comprised an aqueous slurry of about 0.2 wt % calcined ceria (Advanced Nano Products Co., Ltd., "ANP", average particle size of about 100 nm), in deionized water at a pH of about 4. Additional components of the CMP compositions are shown in Table 1, in which "Quat" refers to poly(methacryloyloxyethyl trimethylammonium chloride) from Alco Chemical (Alco 4773); p(4-PV) refers to poly(4-vinylpyridine); TMDP refers to 4,4'-trimethylenedipyridine; and PEG 1450 refers to poly(ethylene glycol) having a number average molecular weight of about 1450 Daltons.

TABLE 1

| Example | Quat, ppm | 4-PVP, ppm | TMDP, ppm | PEG 1450, ppm |
|---------|-----------|------------|-----------|---------------|
| 1A | 15 | 30 | 0 | 30 |
| 1B | 15 | 0 | 100 | 0 |
| 1C | 15 | 15 | 100 | 15 |
| 1D | 0 | 15 | 200 | 15 |

Each composition was used to separately polish 200 mm diameter blanket wafers of silicon nitride, polysilicon, and plasma enhanced tetraethylorthosilicate-derived silicon dioxide (PETEOS) at a downforce (DF) of about 3 psi, a polishing head speed (HS) of about 101 rpm, a platen speed (PS) of about 100 rpm, and a slurry flow rate of about 150 mL/min. The observed removal rates (RR) for silicon nitride (Nitride), polysilicon (PolySi) and PETEOS (Oxide), in Å/min, are shown in Table 2 and the FIGURE.

TABLE 2

| Example | Nitride RR | PolySi RR | Oxide RR |
|---------|------------|-----------|----------|
| 1A | 754 | 109 | 371 |
| 1B | 894 | 79 | 726 |
| 1C | 908 | 88 | 1407 |
| 1D | 46 | 21 | 277 |

The results in Table 2 and the FIGURE demonstrate that the compositions of the invention containing a quaternary ammonium-substituted polymer or a combination of poly(vinylpyridine) and quaternary ammonium-substituted polymer provided very good nitride removal rates (>800 Å/min), low polysilicon removal rates (<110 Å/min), and moderate to high oxide removal rates (371 to 1407 Å/min) under the specified polishing conditions. The composition with the TMDP had enhanced nitride removal rates 894 to 908 Å/min) compared to the composition without the non-polymeric UNH compound (754 Å/min). The composition comprising poly(4-vinylpyridine), but without a quaternary ammonium-substituted polymer provided a low nitride removal rate.

Example 2

Evaluations of additional formulations lacking poly(4-vinylpyridine) were performed on a Mirra polisher with a POLITEX® pad, at a down pressure of about 3 psi, a polishing head speed (HS) of about 101 rpm, a platen speed (PS) of about 100 rpm, and a slurry flow rate of about 150 mL/min. Each of the tested compositions were prepared with calcined ceria in deionized water as in Example 1 and had a pH of about 4. The concentration of the various components, of the formulations are shown in Table 3, while the observed polishing rates for nitride, polysilicon and oxide, in A/min are shown in Table 4. In each of Tables 3 and 4, the abbreviations used are the same as those used in Example 1.

TABLE 3

| Example | Ceria wt % | TMDP ppm | Quat ppm | PEG 1450 ppm |
|---------|-----------|----------|----------|--------------|
| 2A | 0.2 | 0 | 0 | 0 |
| 2B | 0.2 | 75 | 15 | 800 |
| 2C | 0.2 | 50 | 30 | 800 |
| 2D | 0.2 | 50 | 15 | 800 |
| 2E | 0.2 | 50 | 0 | 800 |
| 2F | 0.2 | 75 | 0 | 800 |
| 2G | 0.2 | 100 | 30 | 800 |
| 2H | 0.2 | 100 | 0 | 800 |
| 2I | 0.2 | 75 | 30 | 800 |
| 2J | 0.2 | 100 | 15 | 800 |
| 2K | 0.3 | 75 | 15 | 800 |
| 2L | 0.1 | 75 | 15 | 800 |

TABLE 4

| Example | Nitride RR | PolySi RR | Oxide RR |
|---------|-----------|-----------|----------|
| 2A | 142 | 180 | 2012 |
| 2B | 1019 | 66 | 1757 |
| 2C | 1155 | 57 | 1588 |
| 2D | 1028 | 66 | 1903 |
| 2E | 722 | 100 | 1519 |
| 2F | 778 | 72 | 1591 |
| 2G* | 967 | 64 | 1121 |
| 2H | 795 | 71 | 1688 |
| 2I* | 1067 | 61 | 1363 |
| 2J | 1040 | 52 | 1820 |
| 2K | 1051 | 80 | 1835 |
| 2L | 911 | 63 | 1628 |

*= average of two independent runs

As shown in the data in Table 4, all of the compositions exhibited high oxide removal rates. Removal rates for compositions of the invention containing the quaternary polymer all were greater than 1000 Å/min, compared to controls without the quaternary polymer (2A, 2E, 2F and 2H), which were less than 800 Å/min. All of the compositions of the invention also exhibited low polysilicon removal rates of less than 100 Å/min.

Example 3

This example illustrates the effect of including an EO/PO block copolymer in CMP compositions of the invention, in addition to PEG 1450. Evaluations were performed on a Mirra polisher with a D100 pad, at a down pressure of about 3 psi, a polishing head speed (HS) of about 101 rpm, a platen speed (PS) of about 100 rpm, and a slurry flow rate of about 150 mL/min. Each of the tested compositions were prepared with calcined ceria in deionized water as in Example 1 and had a pH of about 4 except for Examples 3K and 3L, which had a pH of about 2.3. The concentration of the various components of the formulations are shown in Table 5, while the observed polishing rates for nitride, polysilicon and oxide, in A/min are shown in Table 6. In each of Tables 5 and 6, L31 refers to PLURONIC® L31 surfactant (BASF), and the remaining abbreviations are the same as those used in Example 1.

TABLE 5

| Example | L31 ppm | Ceria wt % | TMDP ppm | Quat ppm | PEG 1450 ppm |
|---------|---------|------------|----------|----------|--------------|
| 3A | 500 | 0.2 | 100 | 70 | 800 |
| 3B | 500 | 0.2 | 100 | 50 | 800 |
| 3C | 500 | 0.2 | 140 | 50 | 800 |
| 3D | 500 | 0.2 | 60 | 90 | 800 |
| 3E | 500 | 0.2 | 60 | 70 | 800 |
| 3F | 500 | 0.2 | 60 | 50 | 800 |
| 3G | 500 | 0.2 | 100 | 90 | 800 |
| 3H | 500 | 0.2 | 140 | 90 | 800 |
| 3I | 500 | 0.2 | 140 | 70 | 800 |
| 3J | 500 | 0.1 | 100 | 70 | 800 |
| 3K | 0 | 0.2 | 100 | 30 | 800 |
| 3L | 500 | 0.2 | 100 | 30 | 800 |

TABLE 6

| Example | Nitride RR | PolySi RR | Oxide RR |
|---------|-----------|-----------|----------|
| 3A | 1272 | 30 | 168 |
| 3B | 1301 | 30 | 166 |
| 3C | 1258 | 26 | 488 |
| 3D | 1338 | 28 | 121 |
| 3E | 1310 | 25 | 245 |
| 3F | 1270 | 25 | 602 |
| 3G | 1365 | 21 | 124 |
| 3H | 1339 | 21 | 124 |
| 3I | 1277 | 26 | 189 |
| 3J | 1205 | 23 | 112 |
| 3K | 1195 | 94 | 1426 |
| 3L | 1079 | 27 | 1392 |

The results in Table 6 demonstrate a high level of selectivity for removal of nitride relative to polysilicon. The nitride removal rates were all greater than about 1000 Å/min even with only 0.1 wt % ceria. At pH 4, the inclusion of an EO/PO block copolymer surprisingly further reduced the oxide removal rates and provided greater nitride-to-oxide selectivity, whereas at pH 2.3 (Examples 3K and 3L) the oxide removal rates were greater than 1300 Å/min.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All numerical values obtained by measurement (e.g., weight, concentration, physical dimensions, removal rates, flow rates, and the like) are not to be construed as absolutely precise numbers, and should be considered to encompass values within the known limits of the measurement techniques commonly used in the art, regardless of whether or not the term "about" is explicitly stated. All methods described herein can be performed in any suitable order unless otherwise indicated herein or otherwise clearly contradicted by context. The use of any and all examples, or exemplary language (e.g., "such as") provided herein, is intended merely to better illuminate certain aspects of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing (CMP) method for selectively removing silicon nitride from a surface of a substrate in preference to removal of polysilicon, the method comprising the steps of:
    (a) contacting a surface of a silicon nitride- and polysilicon-containing substrate with a polishing pad and an acidic aqueous CMP composition; and
    (b) causing relative motion between the polishing pad and the substrate while maintaining a portion of the CMP composition in contact with the surface between the pad and the substrate for a time period sufficient to abrade silicon nitride from the surface;
    wherein the CMP composition comprises:
        (i) about 0.1 to about 0.3 percent by weight of a calcined ceria abrasive;
        (ii) about 10 to about 1000 ppm of at least one non-polymeric unsaturated nitrogen heterocycle compound;
        (iii) 10 to about 1000 ppm of at least one cationic polymer, wherein the cationic polymer comprises a poly(vinylpyridine) polymer, a quaternary ammonium-substituted acrylate polymer, a quaternary ammonium-substituted methacrylate polymer, or a combination of any of the foregoing cationic polymers;
        (iv) 200 to about 2000 ppm of at least one polyoxyalkylene polymer, wherein the polyoxyalkylene polymer comprises a poly(ethylene glycol) polymer, a poly(ethylene glycol)-co-poly(propylene glycol) block copolymer, or a combination thereof; and
        (v) an aqueous carrier therefor, wherein the CMP composition has a pH in the range of about 3 to about 5.

2. The method of claim 1 wherein the polyoxyalkylene polymer comprises a poly(ethylene glycol) polymer comprising an average number of ethylene glycol monomer units in the range of about 300 to about 1500.

3. The method of claim 1 wherein the non-polymeric unsaturated nitrogen heterocycle compound comprises a pyridine compound.

4. The method of claim 1 wherein the non-polymeric unsaturated nitrogen heterocycle compound comprises a pyridinium compound.

5. Then method of claim 1 wherein the non-polymeric unsaturated nitrogen heterocycle compound comprises 4,4'-trimethylenedipyridine.

6. The method of claim 1 wherein the surface of the substrate also comprises silicon dioxide.

* * * * *